(12) United States Patent
Kuntz et al.

(10) Patent No.: US 6,774,056 B2
(45) Date of Patent: Aug. 10, 2004

(54) SONIC IMMERSION PROCESS SYSTEM AND METHODS

(75) Inventors: Jon Kuntz, Kalispell, MT (US); Steven Peace, Kalispell, MT (US); Ed Derks, Kalispell, MT (US); Brian Aegerter, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/200,043

(22) Filed: Jul. 19, 2002

(65) Prior Publication Data

US 2003/0056814 A1 Mar. 27, 2003

Related U.S. Application Data

(63) Continuation-in-part of application No. 09/907,524, filed on Jul. 16, 2001, now Pat. No. 6,511,914, which is a continuation-in-part of application No. 09/907,522, filed on Jul. 16, 2001, now Pat. No. 6,680,253, which is a continuation-in-part of application No. 09/907,552, filed on Jul. 16, 2001, now Pat. No. 6,492,284, which is a continuation-in-part of application No. 09/437,711, filed as application No. PCT/US99/05676 on Mar. 15, 1999, now Pat. No. 6,423,642.

(51) Int. Cl.⁷ .................. H01L 21/31; H01L 21/469
(52) U.S. Cl. .................. 438/782; 438/758; 438/780; 438/781; 438/906; 438/913; 134/89; 134/134; 134/135; 414/935; 414/936; 414/940
(58) Field of Search .................. 438/694, 758, 438/780–82, 906, 913; 134/89, 134–135; 216/37; 439/55, 68; 414/935–936, 940

(56) References Cited

U.S. PATENT DOCUMENTS

| | | | | |
|---|---|---|---|---|
| 4,132,567 A | * | 1/1979 | Blackwood | 134/1 |
| 4,750,505 A | * | 6/1988 | Inuta et al. | 134/153 |
| 5,032,217 A | * | 7/1991 | Tanaka | 216/91 |
| 5,168,886 A | * | 12/1992 | Thompson et al. | 134/153 |
| 5,445,172 A | * | 8/1995 | Thompson et al. | 134/153 |
| 5,658,387 A | | 8/1997 | Reardon et al. | |
| 5,678,116 A | * | 10/1997 | Sugimoto et al. | 396/611 |
| 5,779,796 A | * | 7/1998 | Tomoeda et al. | 118/319 |
| 6,045,533 A | * | 4/2000 | Kriesel et al. | 604/132 |
| 6,244,280 B1 | * | 6/2001 | Dryer et al. | 134/100.1 |
| 6,334,902 B1 | * | 1/2002 | Mertens et al. | 134/1 |
| 6,492,284 B2 | | 12/2002 | Peace et al. | |
| 6,511,914 B2 | | 1/2003 | Wirth et al. | |
| 2002/0029788 A1 | * | 3/2002 | Verhaverbeke et al. | 134/1.3 |
| 2002/0157686 A1 | | 10/2002 | Kenny et al. | |

* cited by examiner

*Primary Examiner*—Matthew Smith
*Assistant Examiner*—Granvill D. Lee, Jr.
(74) *Attorney, Agent, or Firm*—Perkins Coie LLP (57) ABSTRACT

A process system for processing a semiconductor wafer or other similar flat workpiece has a head including a workpiece holder. A motor in the head spins the workpiece. A head lifter lowers the head to move the workpiece into a bath of liquid in a bowl. Sonic energy is introduced into the liquid and travels through the liquid to the workpiece, to assist in processing. The head is lifted to bring the workpiece to a rinse position. The bath liquid is drained. The workpiece is rinsed via radial spray nozzles in the base. The head is lifted to a dry position. A reciprocating swing arm sprays a drying fluid onto the bottom surface of the spinning wafer, to dry the wafer.

18 Claims, 10 Drawing Sheets

SONIC IMMERSION PROCESS SYSTEM AND METHODS

This application is a continuation-in-part of U.S. patent application Ser. Nos. 09/907,524; 09/907,522; and 09/907,552; all filed on Jul. 16, 2001 and now U.S Pat Nos. 6,511,914; 6,680,253; 6,492,284, respectively which applications are each a continuation-in-part of U.S. patent application Ser. No. 09/437,711, filed Nov. 10, 1999, and now U.S. Pat. No. 6,423,642, which was the National Stage of International Application No. PCT/US99/05676 filed Mar. 15, 1999. These applications are incorporated herein by reference.

BACKGROUND OF THE INVENTION

The field of the invention is systems and methods for processing a flat media workpiece.

Various systems and methods have been used in the past for processing flat media workpieces, both individually and in batches or groups of workpieces. In the semiconductor device manufacturing industry, the workpieces are typically flat, thin and round disks or wafers, often made of a semiconductor material. Depending on the manufacturing steps being performed, various liquids, gases or vapors may be applied or sprayed onto the workpiece, while the workpiece is spinning. In some manufacturing steps, process liquids or gases are applied to the bottom surface of a spinning wafer via spray nozzles. Immersion processing has been separately performed by immersing wafers into tanks of liquid process chemicals, with the tanks optionally including a sonic energy source.

While these types of systems and methods have performed well in the past, there remains a need for systems and methods having improved performance characteristics.

Accordingly, it is an object of the invention to provide an improved system and an improved method for processing wafers or other flat media workpieces.

SUMMARY OF THE INVENTION

In a first aspect of the invention, a sonic workpiece processing system has a workpiece holder in a head. A motor is provided for spinning the workpiece held in the workpiece holder. A base has a process bowl or chamber including a sonic energy source, such as a megasonic transducer. A liquid and/or gas chemical applicator, such as a nozzle, is provided on a swing arm. A head lifter is adapted to move the workpiece into an immersion position, a rinse position, and a dry position. The workpiece is sequentially moved into the three positions by either lifting the head, or lowering the base. Versatile workpiece processing is provided, as the system allows for immersion processing, sonic processing, and spin processing, rinsing and drying, within a single system, and without the need to move the workpiece between systems.

In a second aspect, one or more quick drain valves are provided in the bowl, to rapidly drain liquid after immersion processing. As a result, processing of the workpiece is expedited and risk of contamination from used immersion liquid, is reduced.

In a third aspect, in a method for processing a workpiece, the workpiece is immersed in a liquid bath. Sonic energy is provided into the bath, while the workpiece is stationary, or spinning. The workpiece is withdrawn from the bath and rinsed. The rinsing is preferably performed by spinning the workpiece while spraying rinsing liquid onto the workpiece. The bath liquid is advantageously quickly drained before the rinsing step is completed. The workpiece is then moved to a drying position. A spray arm sprays or applies a drying fluid, such as IPA or nitrogen, to the workpiece, while the workpiece is spinning. The spray arm preferably reciprocates back and forth underneath the spinning workpiece, to allow for more uniform application of the drying fluid to all areas of the bottom surface of the workpiece. The method provides for expedited and efficient workpiece processing, with both immersion, sonic and spray/spin capabilities, resulting in a wide range of applications.

Other objects, features and advantages will also be apparent from the following detailed description and drawings. The invention resides as well in subsystems of the apparatus and methods described.

BRIEF DESCRIPTION OF THE DRAWINGS

The drawings show a single embodiment of the invention. It will, of course, be apparent that various other embodiments may also be made, within the scope of the invention. The same element number refers to the same element in each of the drawing views.

DETAILED DESCRIPTION OF THE DRAWINGS

The word "wafer" or "workpiece" here means a semiconductor wafer, memory media or disk, optical masks or media, or other flat workpieces requiring processing with low levels of contamination, whether made of semiconductor or non-semiconductor materials.

Turning now in detail to the drawings, as shown in FIGS. 1–4, a process system 10 has a head 12 supported on a head lifter or elevator 20, with the head 12 vertically movable relative to a base 14. The base 14 optionally includes a base plate 16 on or through which the head lifter 20 is mounted. A lift arm 24 extends from the head lifter 20 and is attached to a head armature 22 within the head 12. An exhaust ring or cover 18 on top of the base plate 16 surrounds the head 12.

Figure 16:
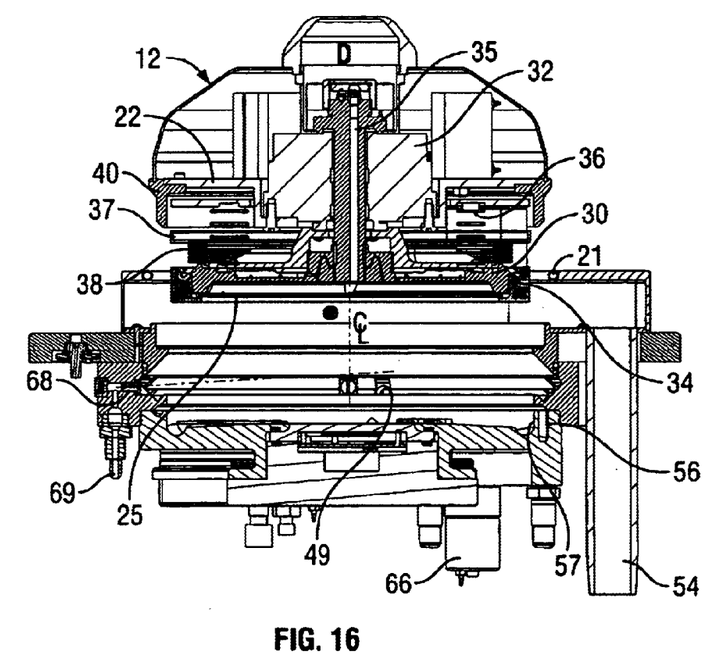
FIG. 16 is a section view taken along line B—B of FIG. 5 and showing the system of FIG. 1 in the dry position.
Figure 17:
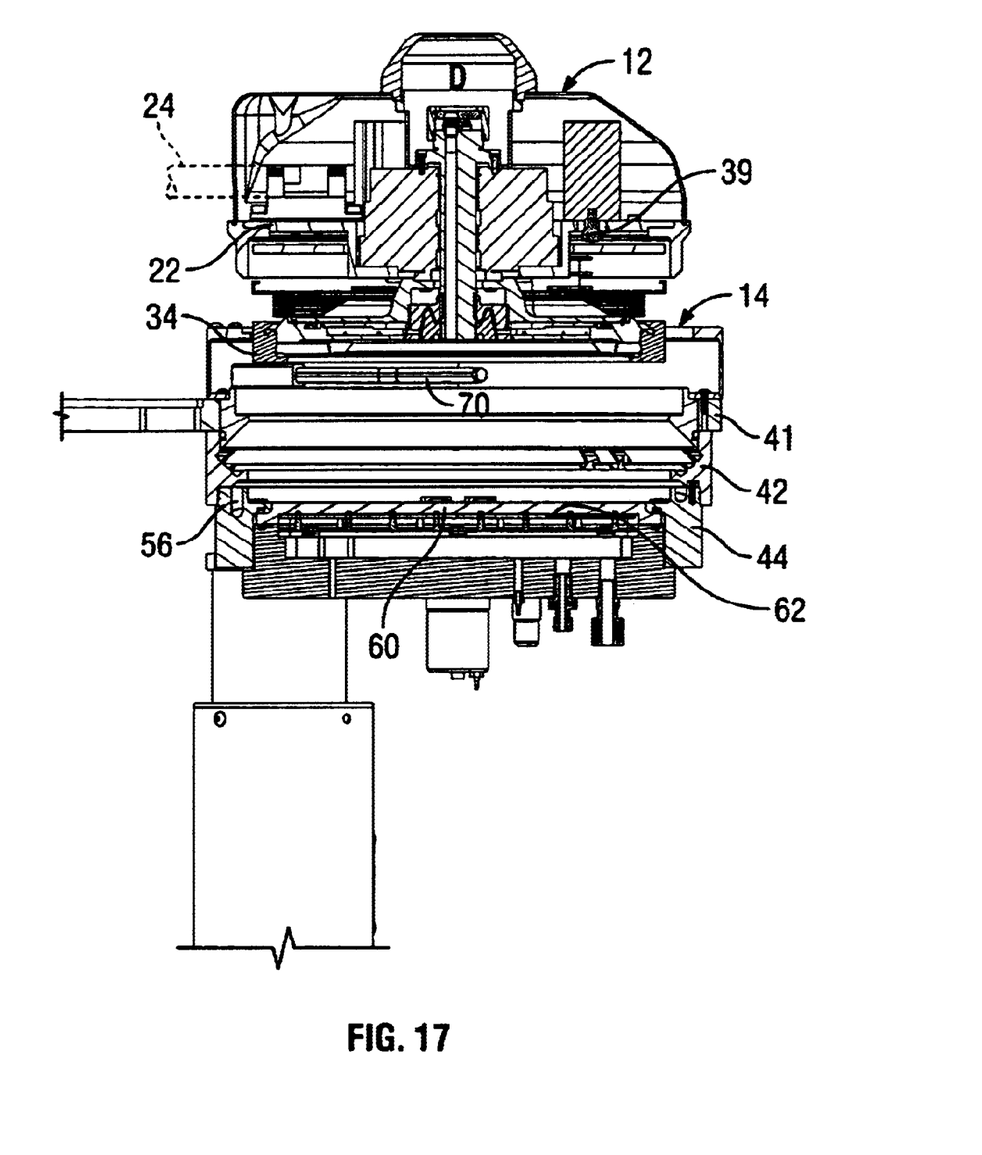
FIG. 17 is a section view taken along line C—C of FIG. 5 and showing the system of FIG. 1 in the dry position.

Referring momentarily to FIGS. 16 and 17, the head 12 includes a rotor plate or inner rotor 30 driven by a spin motor 32. The workpiece or wafer 25 to be processed is secured in place between the lower surface of the rotor plate 30 and a rotor ring or outer rotor 34 surrounding the rotor plate 30. Springs 36 pull the rotor ring 34 up against the rotor plate 30. Bellows 38 extend from the top of the rotor plate 30 to a rotor disk 37, to help prevent migration of process chemicals into the head 12, thereby helping to avoid corrosion of head components. A backside chemical delivery line 35 extends down through the head 12, to optionally deliver a process liquid chemical to the back or topside of the workpiece 25. A head ring 40 is attached to the head armature 22 and is aligned with the head opening 19 in the exhaust ring 18 of the base 14. A seal 21 is optionally provided on the exhaust ring, to seal the head against the base 14, during immersion processing.

Figure 18:
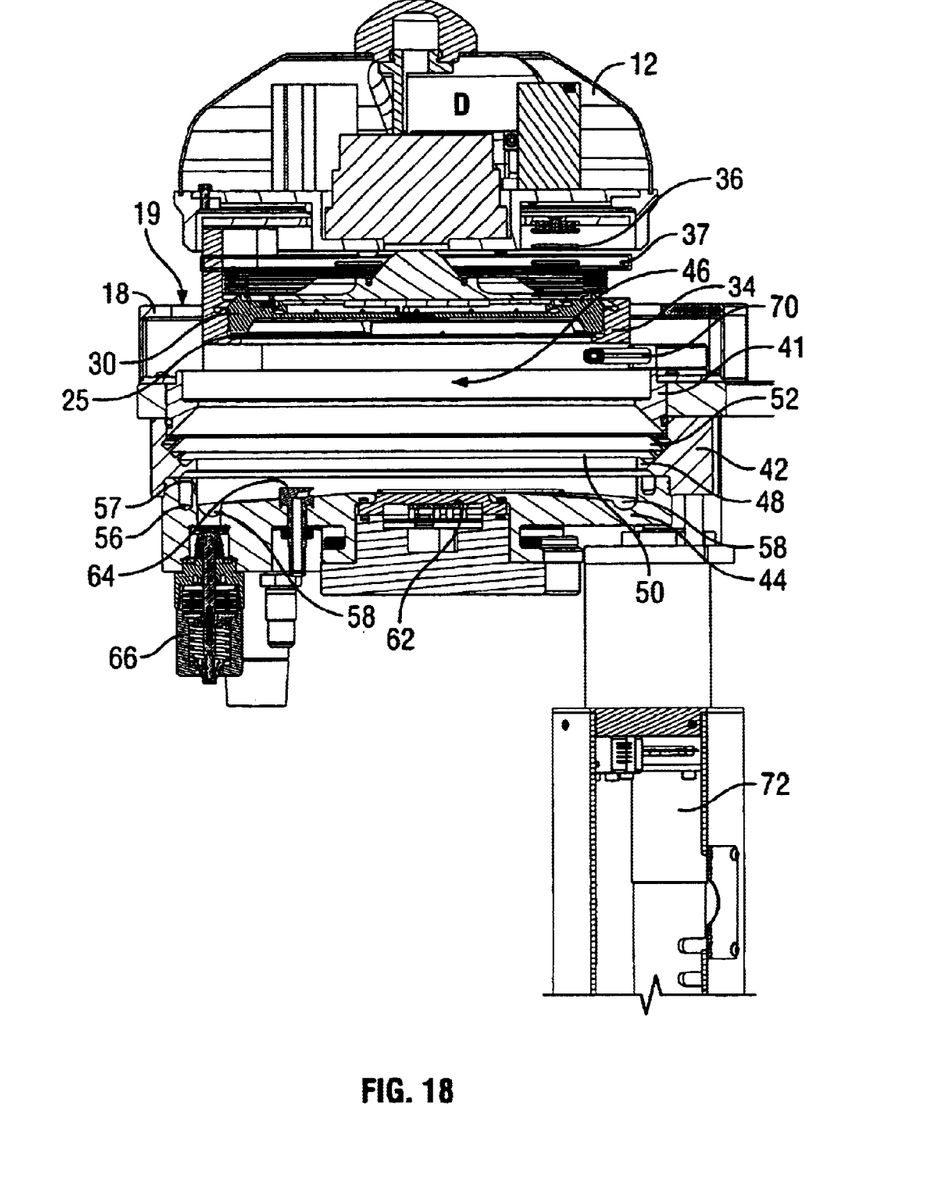
FIG. 18 is a section view taken along line D—D of FIG. 5 and showing the system of FIG. 1 in the dry position.

As best shown in FIG. 18, the base 14 includes a first or upper bowl ring 41 on top of a second or lower bowl ring 42. A bowl or bottom plate 44 is joined with the lower bowl ring 42, to form a process chamber or bowl 46. The lower bowl ring 42 has first, second and third deflector rings 48, 50 and 52 which lead into a deflector drain 49 (shown in FIG. 16). The deflector rings reduce splashback of liquid onto the workpiece during rinsing. An annular weir 57 in the bowl has a height which determines the maximum liquid level in the bowl. Liquid flowing over the weir runs down into a weir drain 56. A bowl drain 58 in or on the bowl plate 44 runs down to fast drain valves 66. Immersion fill spray nozzles 64 extend up through the bowl plate 44, for use in filling the bowl 46 with liquid for immersion processing.

Referring to FIG. 17, a sonic transducer 62, such as a megasonic transducer or array, is attached to a resonator plate 60. The resonator plate 60 is either attached to the bowl plate 44, or otherwise forms the bottom surface of the bowl 46.

As shown in FIG. 16, one or more radial spray nozzles 68 connect with nozzle ports 69, to spray liquid or gas radially inwardly, at a vertical position adjacent to the second and third deflector rings 50 and 52. An exhaust line 54 is connected to a vacuum source and leads into the exhaust ring 18, to draw away used vapors or gases.

Figure 1:
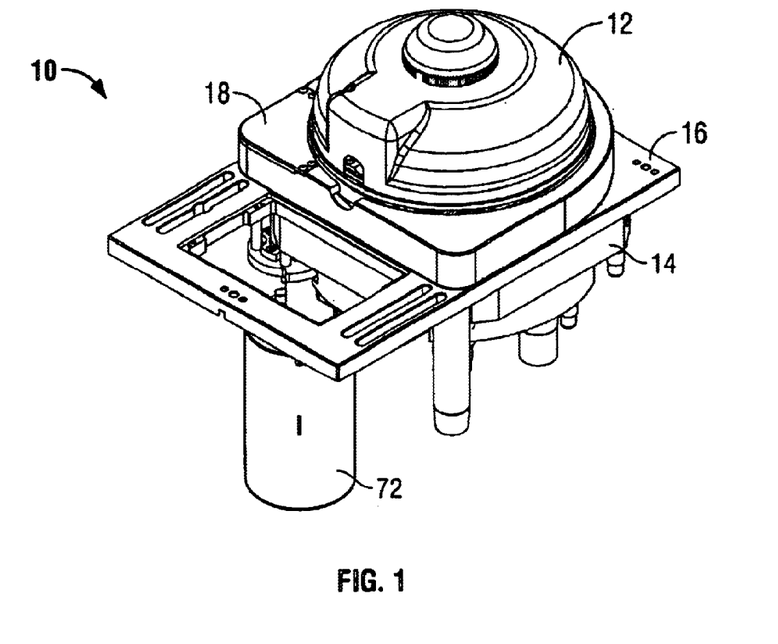
FIG. 1 is a perspective view of the present process system, in the immersion position.
Figure 2:
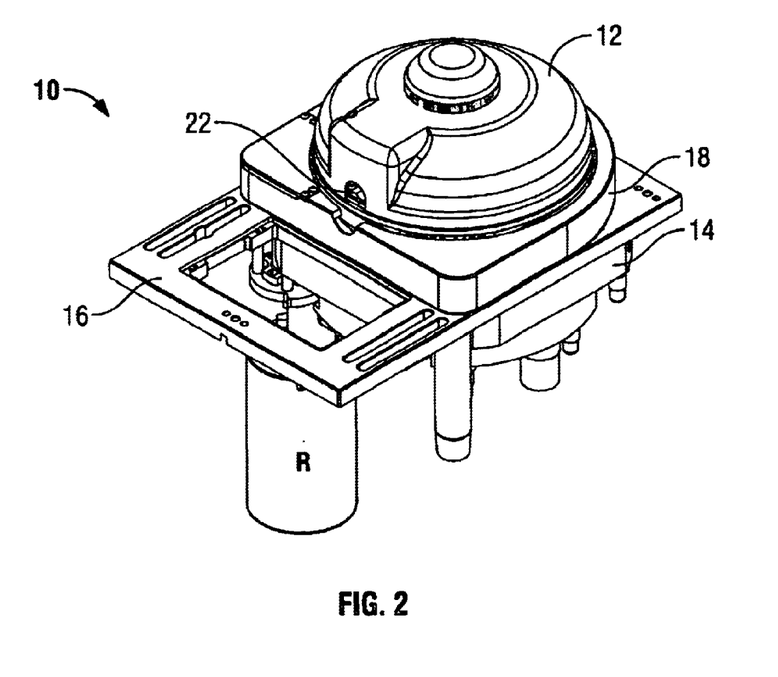
FIG. 2 is a perspective view of the process system of FIG. 1, shown in the rinse position.
Figure 3:
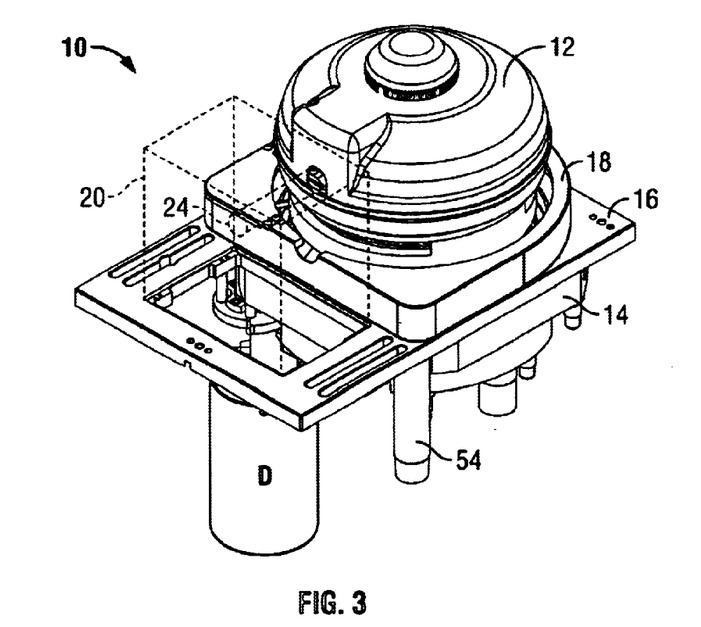
FIG. 3 is a perspective view of the process system of FIG. 1, shown in the dry position, and also showing the head lifter in dotted lines.
Figure 4:
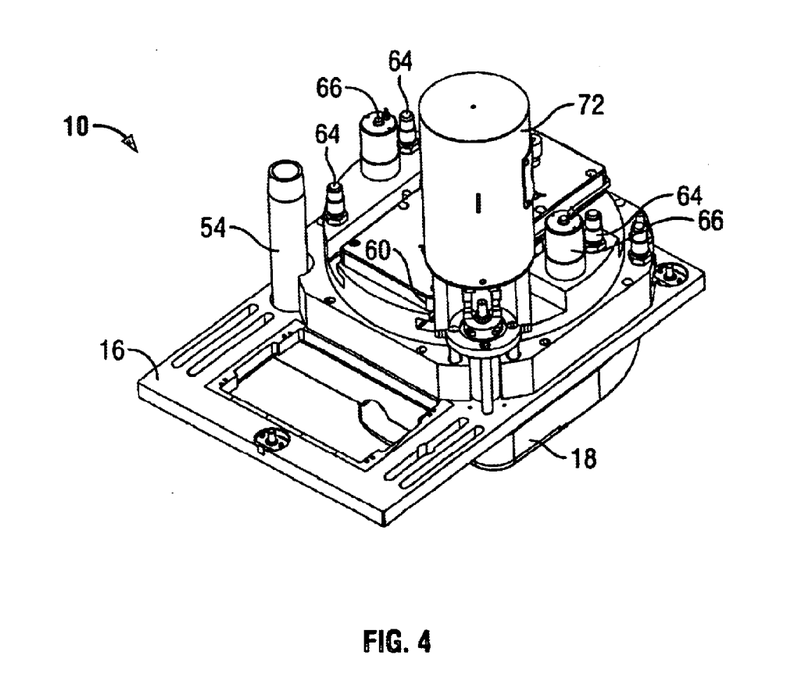
FIG. 4 is a perspective bottom view of the process system shown in FIG. 1.
Figure 5:
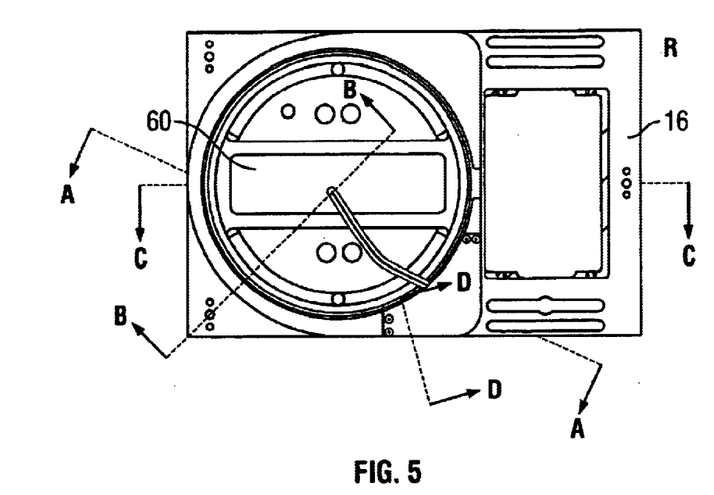
FIG. 5 is a plan view of the process system shown in FIG. 1, with the head removed for clearer illustration.
Figure 6:
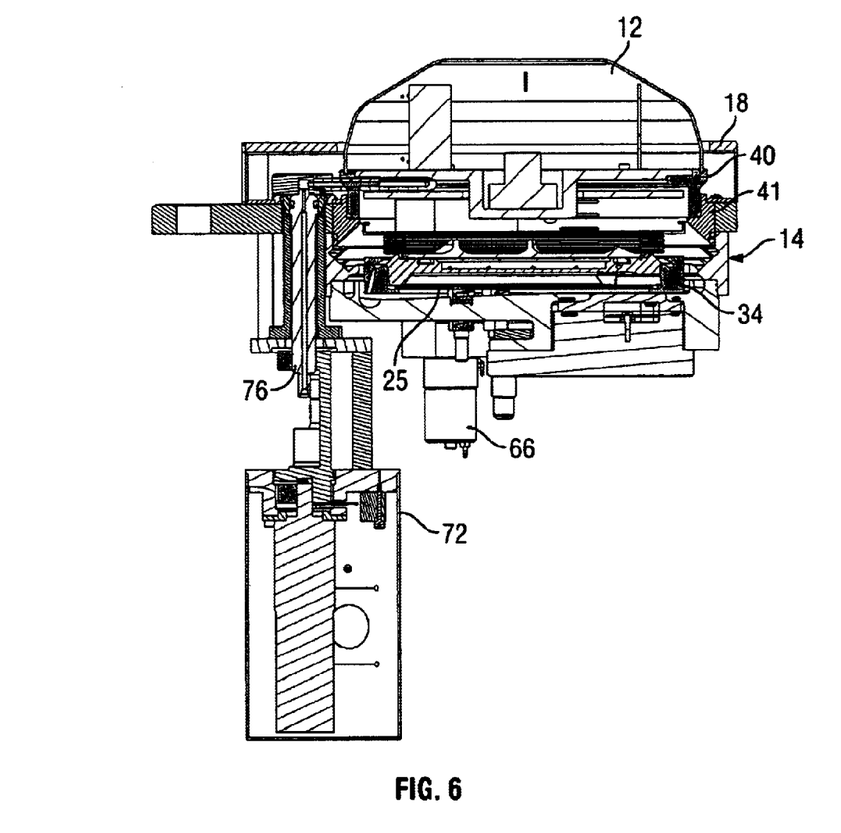
FIG. 6 is a section view taken along line A—A of FIG. 5 and showing the system of FIG. 1 in the immersion position.
Figure 7:
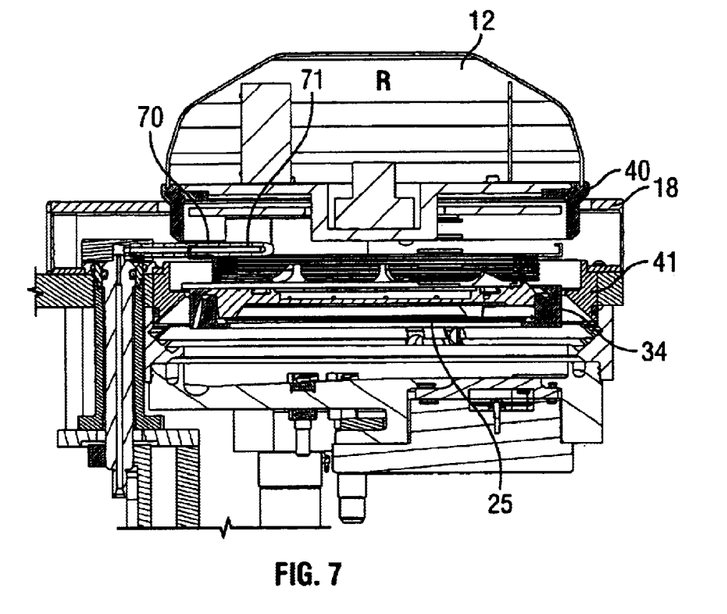
FIG. 7 is a section view taken along line A—A of FIG. 5 and showing the system of FIG. 1 in the rinse position.
Figure 8:
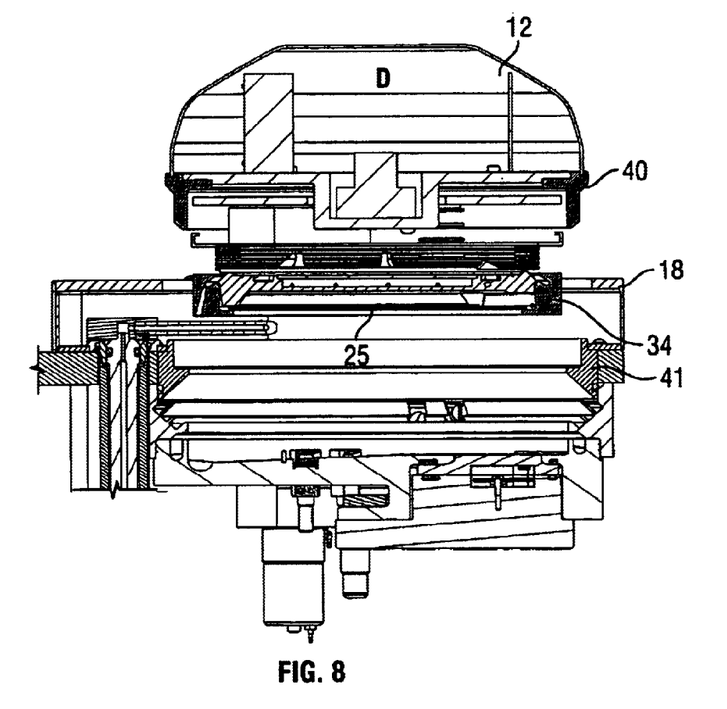
FIG. 8 is a section view taken along line A—A of FIG. 5 and showing the system of FIG. 1 in the dry position.
Figure 9:
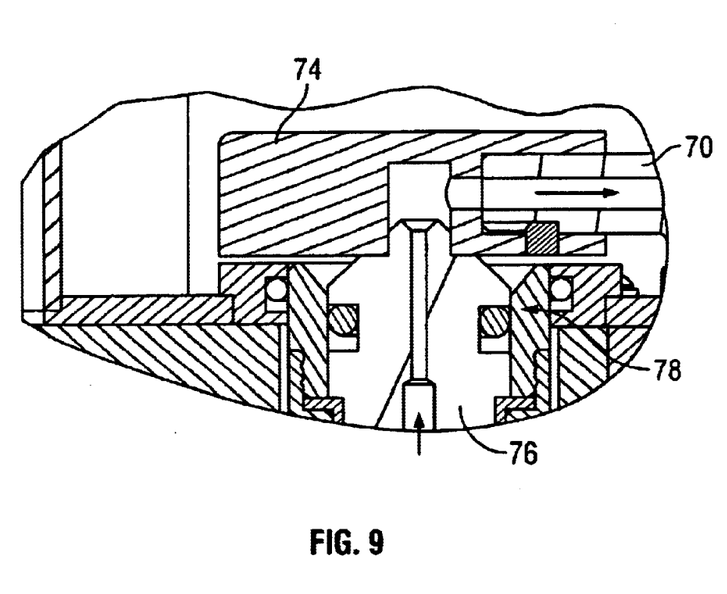
FIG. 9 is an enlarged detail view of the arm cap and seal assembly of the swing arm harmonic drive assembly shown in FIG. 6.
Figure 10:
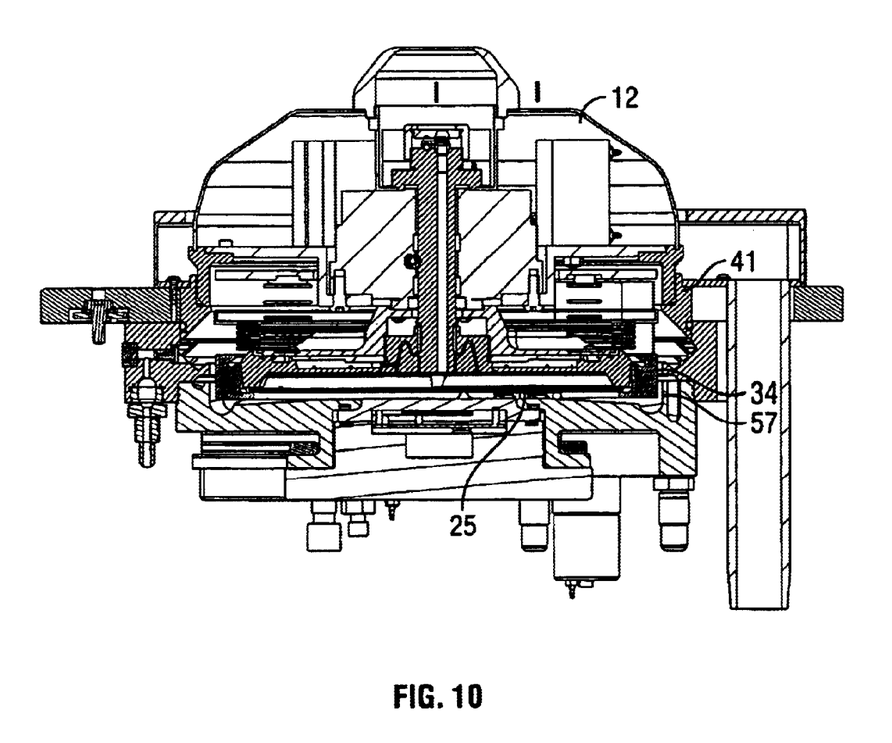
FIG. 10 is a section view taken along line B—B of FIG. 5 and showing the system of FIG. 1 in the immersion position.
Figure 11:
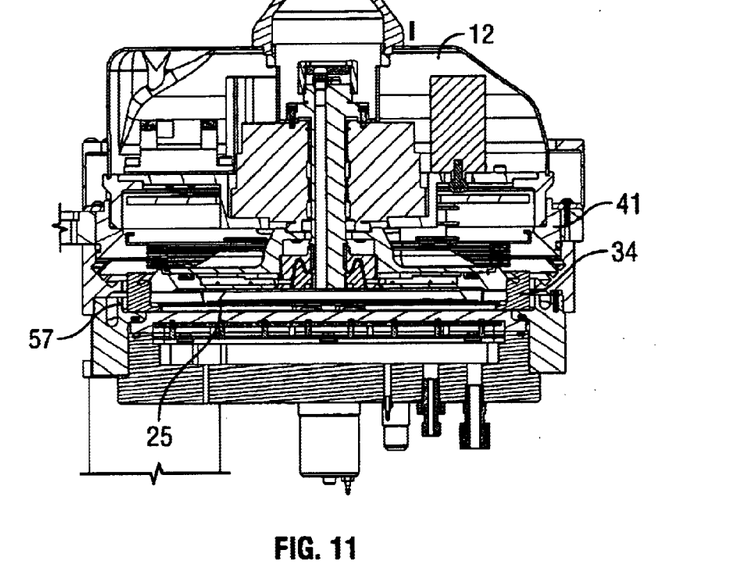
FIG. 11 is a section view taken along line C—C of FIG. 5 and showing the system of FIG. 1 in the immersion position.

As shown in FIGS. 5–9, a swing arm 70 is supported on and driven by a swing arm harmonic drive assembly 72. The swing arm 70 has spray nozzles 71 for spraying drying fluids upwardly onto the workpiece 25, when the workpiece 25 is in the dry position. Referring specifically to FIG. 9, the spray arm 70 is attached to an arm cap 74 supported on top an arm shaft 76 of the drive assembly 72. A seal assembly 78 allows drying liquids or gases to move up through the drive assembly 72, to the arm spraying nozzles 71, while the arm moves in a reciprocating motion.

In use, a wafer 25 is loaded into the head 12. For loading and unloading, the head lifter 20 lifts the head away from the base 14. The wafer 25 is then advantageously loaded into the rotor ring 34 by a robot. The head lifter 20 optionally includes a head rotator, to pivot the head on the lift arm 24 into an upside down position, for loading and unloading. A rotor ring actuator 39 in the head 12 (shown in FIG. 17) displaces the rotor ring 34 away from the rotor plate 30, against the force of the rotor springs 36, for loading and unloading.

Figure 12:
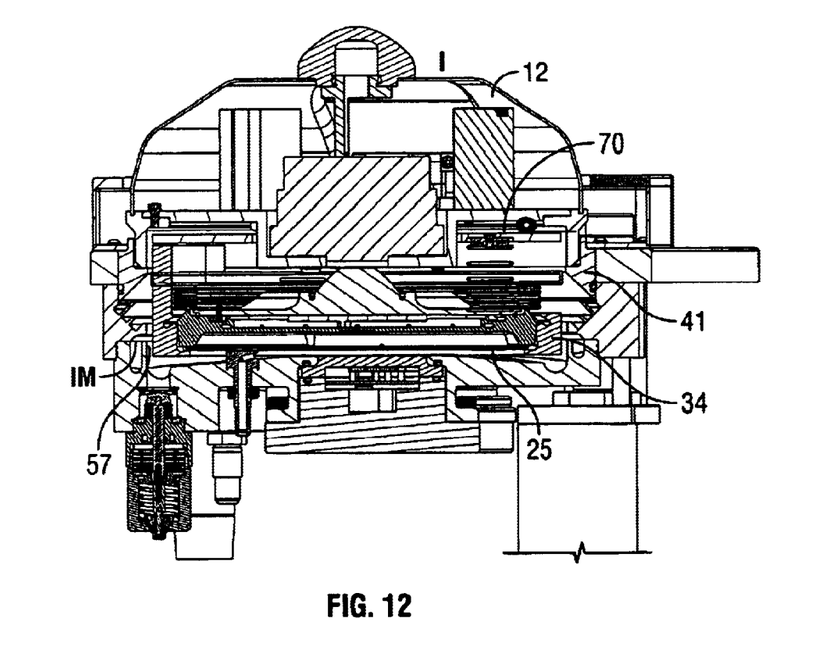
FIG. 12 is a section view taken along line D—D of FIG. 5 and showing the system of FIG. 1 in the immersion position.

With a wafer 25 loaded into the head 12, the head lifter 20 lowers the head 12 towards the base 14. In the preferred method, an immersion processing step is initially performed. Process liquid is supplied to the bowl 46 through supply lines leading into the immersion fill nozzles 64. The drain valves 66 are closed. The bowl 46 fills with liquid up to the immersion fluid level IM in FIG. 12. Any excess liquid above the level IM flows over the weir 57 and drains out through the weir drain 56. The head 12 is moved down so that the workpiece or wafer 25 is immersed in the bath of liquid within the bowl 46.

The liquid may be DI water, optionally including chemistries, including ozone. The liquid may also be a peroxide based chemistry, such as SC1 or SC2. During the immersion step, the workpiece 25 may be stationary or the workpiece 25 may more preferably slowly spin within the bath, via the spin motor 32 in the head 12. The liquid bath in the bowl 46 may be static, or more preferably, a continuous supply of fresh liquid may be provided into the bowl 46 via the nozzles 64, with excess liquid flowing outwardly and into the weir drain 56. With the workpiece 25 immersed in the bath of liquid, the sonic transducer 62 is turned on. Sonic energy travels through the liquid to the workpiece 25, causing cavitation on the bottom or device side of the workpiece, to assist or expedite in processing. The position of the workpiece 25 and other system components, when the workpiece 25 is in the immersion position, are shown in FIGS. 1, 6 and 10–12. The motor 32 preferably spins the workpiece 25, while sonic energy is supplied, to better distribute the sonic energy over the workpiece, and also to help circulate the immersion liquid to carry away contaminants.

While in the immersion position shown in FIGS. 6 and 10–12, the wafer 25 is preferably immersed slightly below the meniscus of the liquid in the bowl 46. This allows immersion liquid to not only to come into contact with the bottom or device side of the wafer, but also the back or top side of the wafer. The head can also deliver process or rinse fluids to the backside of the wafer via the head supply line 35. This is useful to cover the backside of the wafer completely with liquid. Sonic waves passing through the wafer substrate itself will cause cavitation on the backside of the wafer (as well as the device side), helping to provide a secondary cleaning step of the wafer backside.

Throughout the immersion step, the liquid in the bowl 46 is preferably continuously replenished (flowing in via the fill nozzles 64, and out over the weir 48 and into the weir drain 56) for several reasons. The first reason is to replenish liquid displaced by the head immersing itself into the bowl, and to replenish liquid pumped out by the rotation of the workpiece. The second reason is to remove contaminated liquid from the bowl and replenish it with fresh liquid. The third reason is for maintenance of the megasonic transducer or array. A continuous flow of liquid helps the megasonic array or transducer 62 to dissipate excess heat and stay at a cool running temperature. It also flushes away gas bubbles that adhere to the megasonic array (due to cavitation), which improves the efficiency of sonic energy transfer to the wafer.

Figure 13:
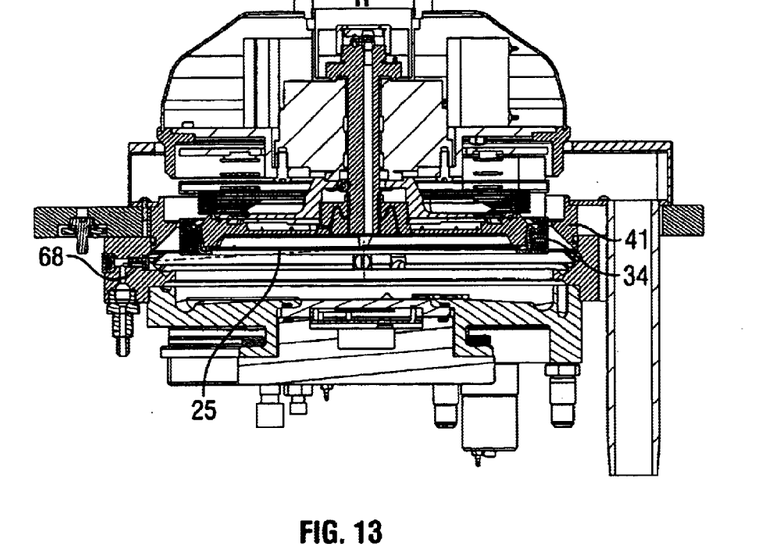
FIG. 13 is a section view taken along line B—B of FIG. 5 and showing the system of FIG. 1 in the rinse position.

In most applications, after immersion, the workpiece 25 is rinsed. Referring to FIG. 13, the head 12 is lifted away from the base 14 to move the workpiece 25 to the rinse position. In the rinse position, the workpiece 25 is slightly above the one or more radially spray nozzles 68. The workpiece is preferably briefly spun at a high rpm speed, to fling off immersion liquid. A rinse liquid, such as DI water, is sprayed from the radial spray nozzles 68, inwardly and onto the down facing surface of the workpiece 25. As shown in dotted lines in FIG. 13, the radial spray nozzles or rinse nozzles 68 are positioned to spray at a slight upwardly angle, towards the center of the workpiece. The spin motor 32 spins the rotor plate 30 rotor ring 34 and workpiece 25, while the rinse liquid is sprayed radially inwardly onto the workpiece. The rinse liquid flows radially outwardly over the workpiece, via centrifugal force, and drains through or out of the rotor ring 34. While the rinse position will generally be used for rinsing the immersion liquid off of the workpiece, this position may also be used to apply an etchant.

Before or during the rinse step, the fast drain valve 66 is opened, to allow the bath liquid to quickly drain out of the bowl 46. This helps to avoid having any of the used bath liquid, or vapors from the liquid, from redepositing on the workpiece 25 and causing potential contamination of the workpiece.

Figure 14:
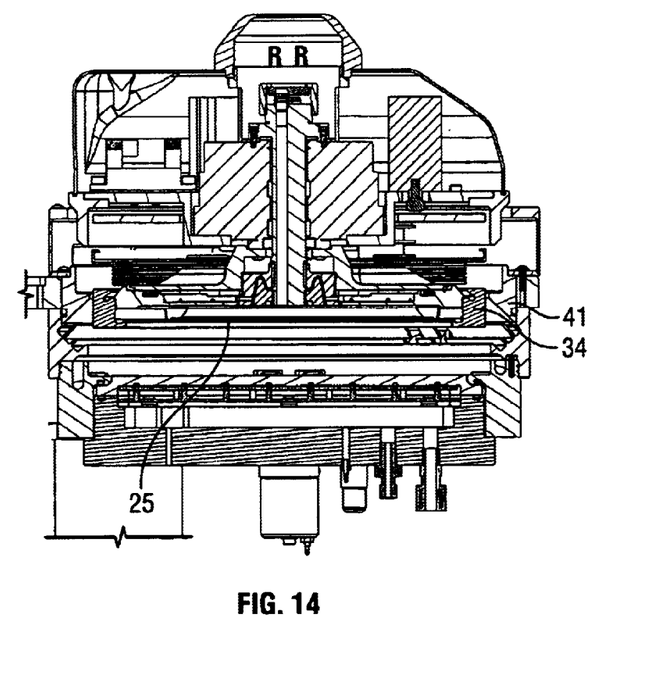
FIG. 14 is a section view taken along line C—C of FIG. 5 and showing the system of FIG. 1 in the rinse position.
Figure 15:
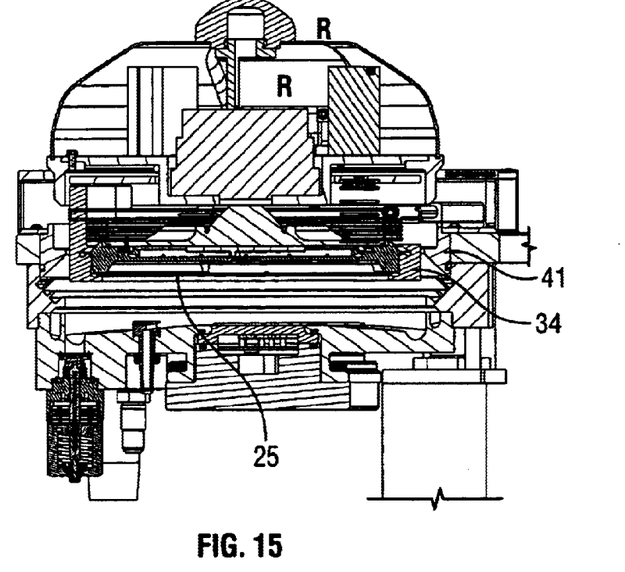
FIG. 15 is a section view taken along line D—D of FIG. 5 and showing the system of FIG. 1 in the rinse position.

The position of the head 12 and other head and base components, in the rinse position, is shown in FIGS. 13, 14 and 15.

Following rinsing, the workpiece is typically dried. The drying step is performed by lifting the head 12 to the dry position, shown in FIGS. 3, 8 and 16–18. Once the head is moved into the dry position, the swing arm 70 pivots radially inwardly to a position underneath the workpiece 25. The spin motor 32 spins the workpiece at a high speed. Simultaneously, drying liquids or gases, such as IPA (isopropyl alcohol) and/or heated nitrogen gas, are sprayed from the spray nozzles 71 on the arm 70, onto the bottom surface of the workpiece 25. The fluid supply 35 in the head preferably simultaneously applies drying liquids or gases to the top or back side of the workpiece. The swing arm harmonic drive assembly 72 drives the swing arm 70 in an alternating or reciprocating back and forth movement below the workpiece 25. This swing arm movement, together with rotation of the workpiece, allows the drying fluids to contact substantially all areas of the lower surface of the workpiece. The swing arm may alternatively be moved to deliver fluids to the center of the spinning workpiece, with the fluids distributed over the workpiece by centrifugal force. After the workpiece is dried, the head lifter 20 lifts the head 12 for unloading of the workpiece.

Depending on the liquid, gas or vapor chemistries used in processing, the exhaust line 54 may continuously or intermittently draw off vapors and gases from the bowl 46. The vacuum source connected to the exhaust line 54 creates a continuous flow of air into the bowl 44 through the head opening 19 in the exhaust ring 18, and out through the exhaust line 54. Consequently, vapors and gases do not escape out of the system 10 upwardly through the head opening 19. In addition, movement of the gases or vapors into the head 12 is reduced or eliminated, reducing corrosion of head components, or cross-contamination.

To perform the steps performed above, in an alternative embodiment, the head 12 may be fixed, while the base 14 is moved, to equivalently position the workpiece 25 into the immersion, rinse or dry positions. The base and head components may be made of stainless steel or Teflon (fluorine containing resins), depending on the chemistries to be used.

Thus, a novel process system has been shown and described. It will be apparent that various substitutions and changes can be made, without departing from the spirit and scope of the invention. The invention, therefore, should not be limited, except to the following claims, and their equivalence.

What is claimed:

1. A process system, comprising:
    a head having a workpiece holder;
    a motor in the head for spinning a workpiece held by the workpiece holder;
    a base having a process bowl;
    a head lifter attached to the head for moving the head vertically relative to the process bowl between a plurality of processing positions;
    a sonic energy source associated with the base;
    a swing arm on one of the head and the base; and
    a process chemical applicator on the swing arm.

2. The system of claim 1 wherein the applicator comprises at least one spray nozzle.

3. The system of claim 1 further comprising liquid inlets in the base for filling the bowl with liquid.

4. The system of claim 1 further comprising a first weir and a second weir in the bowl.

5. The system of claim 1 further comprising one or more fast drain valves in the base, for draining liquid out of the bowl.

6. The system of claim 1 further comprising at least one radial spray nozzle on the base.

7. The system of claim 1 further comprising a workpiece backside chemical delivery line in the head.

8. A method for processing a workpiece comprising the steps of:
    lowering the workpiece to a first position with the workpiece at least partially in a bath of liquid;
    introducing sonic energy into the bath of liquid;
    lifting the workpiece to a second position above the first position, wherein the workpiece is entirely out of the bath of liquid;
    spinning the workpiece;
    spraying the workpiece with a rinsing liquid, while the workpiece is at the second position;
    lifting the workpiece to a third position above the second position;
    swinging an arm under the workpiece; and
    applying a drying fluid from the arm onto the workpiece, while the workpiece is spinning.

9. The method of claim 8 wherein the drying fluid comprises IPA.

10. The method of claim 8 wherein the drying fluid comprises a gas.

11. The method of claim 10 wherein the gas comprises heated nitrogen.

12. The method of claim 8 wherein the drying fluid is sprayed onto a down facing surface of the wafer.

13. The method of claim 8 further comprising the step of reciprocating the arm in a back and forth motion, and then moving the arm into a stored position.

14. The method of claim 8 further comprising the step of separately collecting liquid flung off of the workpiece at the second and third positions.

15. The method of claim 8 further comprising the step of draining the bath liquid before applying the drying fluid.

16. The method of claim 8 further comprising the step of sealing the bath of liquid off from the environment, while the workpiece is in the bath of liquid.

17. A process system, comprising:
 a head having a workpiece holder;
 a motor in the head for spinning a workpiece held by the workpiece holder;
 a head lifter attached to the head;
 a base having a process bowl;
 a resonator plate attached to the process bowl
 a sonic energy source attached to the resonator plate;
 a swing arm on one of the head and the base; and
 a process chemical applicator on the swing arm.

18. A processing system, comprising:
 a head having a workpiece holder;
 a motor for spinning the workpiece holder;
 a head lifter attached to the head;
 a base having a process bowl;
 a resonator plate attached to the process bowl; and
 a sonic energy source attached to the resonator plate.

* * * * *